United States Patent
Chiu et al.

(10) Patent No.: US 10,652,996 B2
(45) Date of Patent: May 12, 2020

(54) FORMABLE SHIELDING FILM

(71) Applicant: 3M INNOVATIVE PROPERTIES COMPANY, St. Paul, MN (US)

(72) Inventors: Chun-Ming Chiu, Zhubei (TW); Wei-Yu Chen, Taipei (TW); I-Liang Lee, Yangmei (TW)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 123 days.

(21) Appl. No.: 15/352,862

(22) Filed: Nov. 16, 2016

(65) Prior Publication Data
US 2017/0181268 A1 Jun. 22, 2017

Related U.S. Application Data

(60) Provisional application No. 62/270,082, filed on Dec. 21, 2015.

(51) Int. Cl.
*H05K 1/02* (2006.01)
*H05K 3/28* (2006.01)
(Continued)

(52) U.S. Cl.
CPC ......... *H05K 1/0216* (2013.01); *H05K 1/0203* (2013.01); *H05K 1/0209* (2013.01);
(Continued)

(58) Field of Classification Search
CPC .. H05K 1/0209; H05K 9/0075; H05K 3/4652; H05K 9/0081; H05K 9/0083;
(Continued)

(56) References Cited

U.S. PATENT DOCUMENTS 5,394,304 A * 2/1995 Jones ...................... B65B 53/02
174/256
5,557,064 A * 9/1996 Isern-Flecha .......... H05K 3/284
174/378
(Continued)

FOREIGN PATENT DOCUMENTS

CN 101355868 1/2009
KR 20120028583 3/2012
(Continued)

*Primary Examiner* — Adam B Dravininkas
(74) *Attorney, Agent, or Firm* — Jonathan L. Tolstedt

(57) ABSTRACT

A shielding film comprises multiple layers including one or more of a structured adhesive layer, an electrically conductive layer, an electrically insulative thermally conductive layer, and an electrically conductive adhesive layer. The electrically conductive shielding layer extends laterally beyond the structured adhesive layer. The electrically insulative thermally conductive layer is disposed between the electrically conductive shielding layer and the structured adhesive layer and is coextensive with the structured adhesive layer. The electrically conductive adhesive layer is disposed between the electrically conductive shielding layer and the thermally conductive layer and is coextensive with the electrically conductive shielding layer. When the multilayer shielding film is placed on an electronic device mounted on a circuit board and under application of one or more of heat, vacuum, and pressure, the multilayer shielding film conforms to the electronic device and the electrically conductive adhesive layer adheres to the circuit board providing a seal between the multilayer shielding film and the circuit board.

23 Claims, 3 Drawing Sheets

(51) Int. Cl.
*H05K 9/00* (2006.01)
*H05K 1/18* (2006.01)

(52) U.S. Cl.
CPC .............. *H05K 1/181* (2013.01); *H05K 3/284* (2013.01); *H05K 9/003* (2013.01); *H05K 9/0088* (2013.01); *H05K 2201/0715* (2013.01); *H05K 2201/10522* (2013.01); *H05K 2203/1311* (2013.01); *H05K 2203/1322* (2013.01)

(58) Field of Classification Search
CPC .............. H05K 3/281; H01L 2924/181; H01L 2224/16225; H01L 2924/01029; H01L 2224/13111; H01L 2224/32245; H01L 2924/01047; H01L 2924/01082; H01L 2924/01013; B32B 7/12; B32B 2307/212
See application file for complete search history.

(56) References Cited

U.S. PATENT DOCUMENTS

| | | | | |
|---|---|---|---|---|
| 5,604,026 A * | 2/1997 | King | ............................ | C09J 9/02 428/317.1 |
| 5,639,989 A * | 6/1997 | Higgins, III | .......... | H01L 23/552 174/386 |
| 6,319,030 B1 | 11/2001 | Wu | | |
| 6,600,101 B2 * | 7/2003 | Mazurkiewicz | ...... | H01L 23/552 174/388 |
| 7,196,275 B2 * | 3/2007 | Babb | ...................... | H01L 23/552 174/377 |
| 7,752,751 B2 * | 7/2010 | Kapusta | ................ | C23C 14/046 29/846 |
| 8,276,268 B2 * | 10/2012 | Kapusta | ............... | H05K 1/0218 29/832 |
| 9,526,195 B2 * | 12/2016 | Su | .......................... | H05K 9/0088 |
| 9,609,792 B2 * | 3/2017 | Su | .......................... | H05K 9/0084 |
| 9,812,774 B2 * | 11/2017 | Jang | ....................... | H01Q 1/526 |
| 9,865,518 B2 * | 1/2018 | Akiba | .................... | H01L 23/552 |
| 9,883,596 B2 * | 1/2018 | Gobl | ....................... | H01L 25/07 |
| 2005/0276934 A1 * | 12/2005 | Fukui | ................... | C08G 65/329 428/32.6 |
| 2006/0152913 A1 * | 7/2006 | Richey | ................ | H05K 1/0218 361/818 |
| 2006/0163197 A1 * | 7/2006 | Arakawa | .................. | B32B 3/30 216/41 |
| 2006/0263570 A1 * | 11/2006 | Bunyan | .................... | B32B 3/02 428/68 |
| 2008/0078500 A1 * | 4/2008 | Sher | .................... | B29C 47/0021 156/289 |
| 2008/0266831 A1 * | 10/2008 | Hwang | ................ | H05K 9/0096 361/818 |
| 2009/0039530 A1 * | 2/2009 | Fryklund | ............ | H01L 21/6835 257/778 |
| 2010/0108370 A1 * | 5/2010 | Kapusta | ............... | H05K 1/0218 174/260 |
| 2010/0294559 A1 * | 11/2010 | Izawa | .................. | H05K 9/0024 174/378 |
| 2010/0319981 A1 * | 12/2010 | Kapusta | ............... | H05K 9/0024 174/350 |
| 2012/0319904 A1 * | 12/2012 | Lee | .......................... | H01Q 1/38 343/700 MS |
| 2013/0120957 A1 * | 5/2013 | Werner | ................ | H05K 9/0032 361/818 |
| 2013/0206315 A1 * | 8/2013 | Chung | ................ | H05K 9/0088 156/60 |
| 2013/0333936 A1 * | 12/2013 | Gundel | ................ | H01B 7/0838 174/350 |
| 2014/0054654 A1 * | 2/2014 | Hsieh | ...................... | H01L 29/78 257/288 |
| 2014/0116748 A1 * | 5/2014 | Gundel | ................ | H01B 7/0861 174/103 |
| 2014/0218851 A1 * | 8/2014 | Klein | ....................... | H05K 3/20 361/679.02 |
| 2015/0016066 A1 * | 1/2015 | Shimamura | ......... | H01L 23/3121 361/728 |
| 2015/0282392 A1 * | 10/2015 | Liu | ...................... | H05K 9/0024 361/707 |
| 2016/0078983 A1 * | 3/2016 | Gundel | ................ | H01B 7/0869 174/102 R |
| 2016/0114568 A1 * | 4/2016 | Sher | ......................... | B32B 7/12 156/219 |
| 2016/0120077 A1 * | 4/2016 | Watanabe | ............ | H05K 1/0216 174/377 |
| 2017/0006707 A1 * | 1/2017 | Park | ........................ | H05K 1/185 |
| 2017/0033086 A1 * | 2/2017 | Homma | .............. | H01L 25/0657 |
| 2017/0345795 A1 * | 11/2017 | Yang | ...................... | H01L 24/03 |

FOREIGN PATENT DOCUMENTS

| TW | 201143594 | 12/2011 |
|---|---|---|
| TW | 201401321 | 1/2014 |

* cited by examiner

FORMABLE SHIELDING FILM

TECHNICAL FIELD

This disclosure relates generally to devices for electromagnetic interference (EMI) shielding and to related methods and systems.

BACKGROUND

Electromagnetic interference (EMI) can detrimentally affect the operation of electronic components. Shielding an electronic system can reduce the impact of EMI for sensitive components of the system. Shielding can also prevent excessive emission of EMI from the electronic system which may affect sensitive components of other systems.

SUMMARY

Some embodiments are directed to a shielding film comprising multiple layers including one or more of a structured adhesive layer, an electrically conductive shielding layer, an electrically insulative thermally conductive layer, and an electrically conductive adhesive layer. The electrically conductive shielding layer is disposed on and extends laterally beyond the structured adhesive layer. The electrically insulative thermally conductive layer is disposed between the electrically conductive shielding layer and the structured adhesive layer and is coextensive with the structured adhesive layer. The electrically conductive adhesive layer is disposed between the electrically conductive shielding layer and the thermally conductive layer and is coextensive with the electrically conductive shielding layer. When the multilayer shielding film is placed on an electronic device mounted on a circuit board and under application of one or more of heat, vacuum, and pressure, the shielding film conforms to the electronic device and the adhesive layer adheres to the circuit board providing a seal between the shielding film and the circuit board.

In accordance with some embodiments, a shielded electronic system includes a circuit board, a plurality of discrete spaced apart electronic devices mounted on the circuit board, and a multilayer shielding film disposed on and covering the electronic devices. The multilayer shielding film includes one or more of a structured adhesive layer, an electrically conductive shielding layer extending laterally beyond the structured adhesive layer, an electrically insulative thermally conductive layer disposed between the electrically conductive shielding layer and the structured adhesive layer and coextensive with the structured adhesive layer, and an electrically conductive adhesive layer disposed between the electrically conductive shielding layer and the thermally conductive layer and coextensive with the electrically conductive shielding layer. The multilayer shielding film substantially conforms to each electronic device. The electrically conductive adhesive layer adheres to the circuit board and provides a seal between the multilayer shielding film and the circuit board. The multilayer shielding film physically contacts the circuit board between at least two neighboring electronic devices.

Some embodiments involve a multilayer shielding film including one or more of a structured adhesive layer, an electrically conductive shielding layer extending laterally beyond the structured adhesive layer, an electrically insulative thermally conductive layer disposed between the electrically conductive shielding layer and the structured adhesive layer and coextensive with the structured adhesive layer, and an electrically conductive adhesive layer disposed between the electrically conductive shielding layer and the thermally conductive layer and coextensive with the electrically conductive shielding layer. Under application of one or more of heat, vacuum, and pressure, the multilayer shielding film substantially conforms and adheres to at least 90% of an exposed outermost surface of a three dimensional object mounted on a substrate. The object has a maximum width d and a minimum height h, h/d being at least 3. The conformed electrically conductive adhesive layer adheres to the substrate to maintain conformity of the multilayer shielding film to the object.

BRIEF DESCRIPTION OF DRAWINGS

The figures are not necessarily to scale. Like numbers used in the figures refer to like components. However, it will be understood that the use of a number to refer to a component in a given figure is not intended to limit the component in another figure labeled with the same number.

DETAILED DESCRIPTION OF ILLUSTRATIVE EMBODIMENTS

Embodiments described herein relate to a multilayer shielding film designed to be conformably disposed over the surface of objects on a substrate, such as electronic devices mounted on a circuit board, wherein the devices emit and/or are sensitive to electromagnetic interference (EMI). When conformably disposed over the electronic devices and sealed to the circuit board, the shielding film serves as a Faraday-type shield that reduces EMI reaching the electronic devices and/or reduces the emission of EMI by the electronic devices beyond the multilayer shielding film.

Figure 1A:
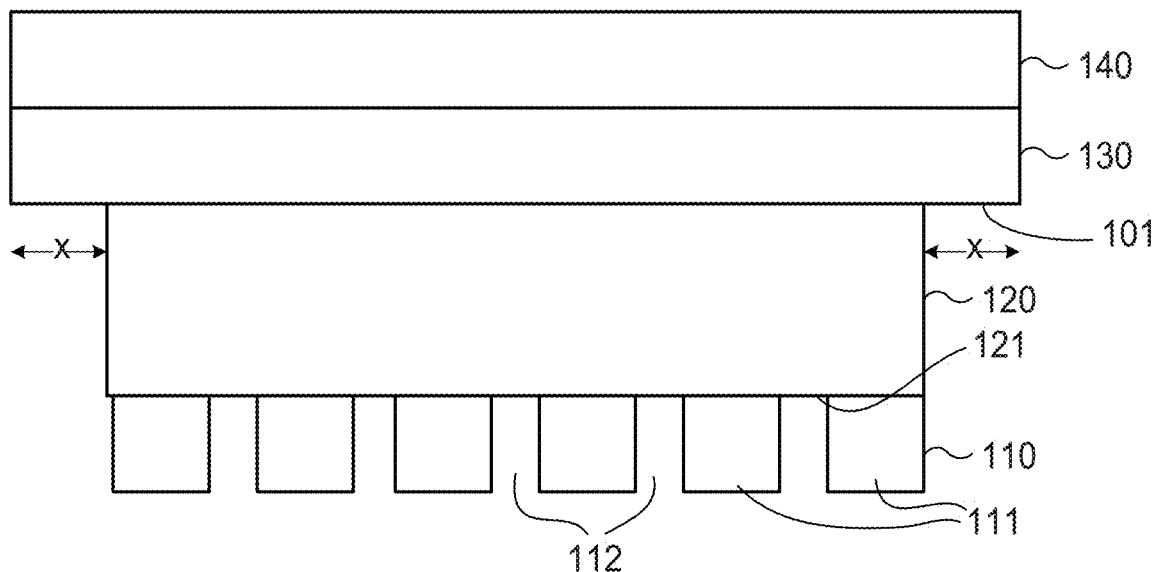
FIG. 1A is a cross sectional view of a multilayer shielding film before it is conformed to one or more objects in accordance with some embodiments.
Figure 1B:
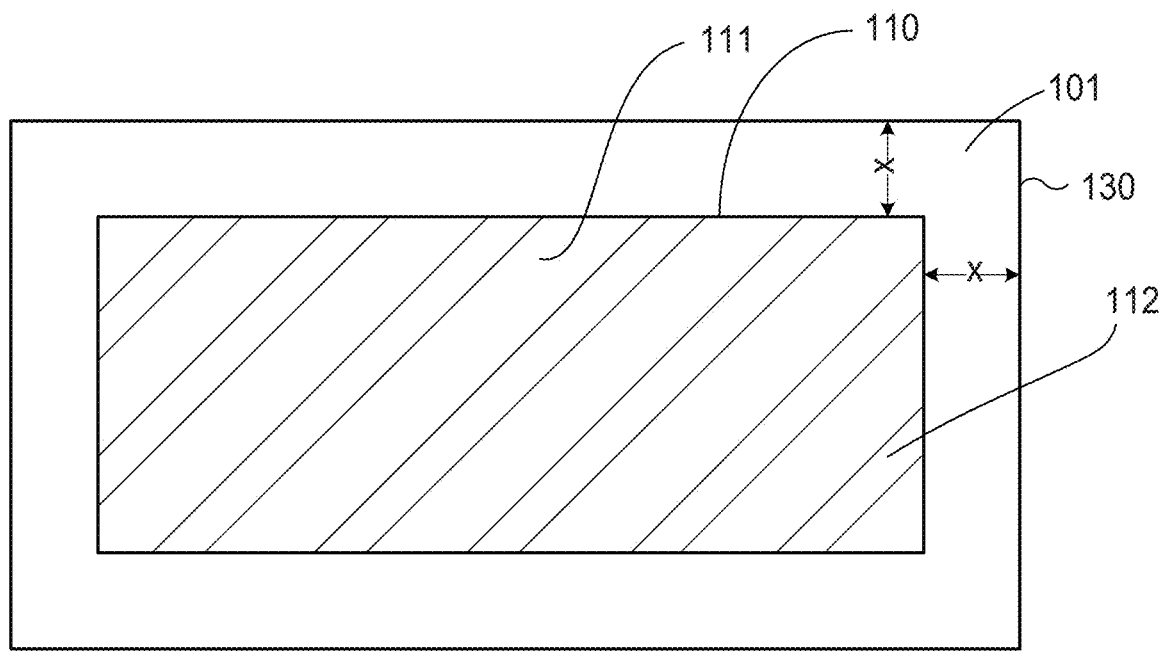
FIG. 1B is a bottom view of the multilayer shielding film of FIG. 1A.

FIG. 1A is a cross sectional view and FIG. 1B is a view of the bottom of a multilayer shielding film 100 before it is placed over components in accordance with some embodiments. The shielding film 100 includes a structured adhesive layer 110. An electrically conductive shielding layer 140 extends laterally beyond the structured adhesive layer 110. An electrically insulative thermally conductive layer 120 is disposed on the structured adhesive layer 110, between the electrically conductive shielding layer 140 and the structured adhesive layer 110. The electrically insulative thermally conductive layer 120 may be coextensive with the structured adhesive layer 110 in some embodiments. An electrically conductive adhesive layer 130 is coextensive with the electrically conductive shielding layer 140 and is disposed between the electrically conductive shielding layer 140 and the electrically insulative thermally conductive layer 120.

In some embodiments, the electrically conductive shielding layer 140 comprises a non-woven layer that includes a plurality of electrically conductive fibers. For example, the conductive fibers may be polyester fibers coated with a metal layer. The metal layer may be deposited on the fibers by a vacuum deposition process such as sputtering, for example. Alternatively, the electrically conductive shielding layer may be a conductive woven material. In various embodiments, the electrically conductive shielding layer 140 may have a thickness less than about 30 microns. The thickness of the coextensive electrically conductive shielding layer 140 and electrically conductive adhesive layer 130 together may be less than about 50 microns, less than about 40 microns, or even less than about 30 microns, for example.

The electrically insulative thermally conductive layer 120 can have a thickness less than about 100 microns, e.g., about 80 microns or about 50 microns, and having a relatively low thermal resistance and a relatively high electrical breakdown voltage. In some embodiments, the thermal resistance of the thermally conductive layer 120 is greater than greater than about $3°$ C.·cm$^2$/W and less than about $5°$ C.·cm$^2$/W, e.g., as measured according to ASTM5470. In some embodiments, the breakdown voltage of the thermally conductive layer can be greater than about 4 kV. The thermally conductive layer 120 may be made of a "halogen-free" material which means that no halogens or only unintentional and/or trace amounts of halogens are contained within the thermally conductive layer 120. The multilayer shielding film 100 may have an S21 isolation of less than about −20 dB or even less than about −40 dB, for example.

The structured adhesive layer 110 may be coextensive with the thermally conductive layer 120 and proximate to a first surface 121 of the thermally conductive layer 120. The structured adhesive layer 110 can include a pattern of adhesive material that covers some, but not all, of the area of the first surface 121 of the thermally conductive layer 120. For example, the structured adhesive layer 110 may comprise a plurality of substantially parallel spaced apart ribs 111 of adhesive material separated by gaps 112 that do not include the adhesive material or include less adhesive material per unit area than the ribs, as illustrated in FIGS. 1A and 1B. The pattern of the adhesive material of the structured adhesive layer 110 allows the shielding film to be repositionable as discussed in more detail below. In some embodiments, the thickness of the structured adhesive layer 110 can be in a range between about 30 microns and about 50 microns.

The electrically conductive adhesive layer 130 is disposed between the electrically conductive shielding layer 140 and the thermally conductive layer 120. In some embodiments, the electrically conductivity of the electrically conductive adhesive layer 120 is provided at least in part from electrically conductive particles, e.g., metallic particles, metal coated particles, and/or other electrically conductive particles in the electrically conductive adhesive layer 130.

As indicated in FIGS. 1A and 1B, the electrically conductive adhesive layer 130 is coextensive with the electrically conductive shielding layer 140. The electrically insulative thermally conductive layer 120 is coextensive with the structured adhesive layer 110. The coextensive electrically conductive adhesive layer 130 and the electrically conductive shielding layer 140 extend laterally beyond the coextensive electrically insulative thermally conductive layer 120 and structured adhesive layer 110 in a perimeter region 101 of the shielding film 100 by a distance, x, of least about 2 mm. In some embodiments, x may be about 3 mm, for example.

Figure 2:
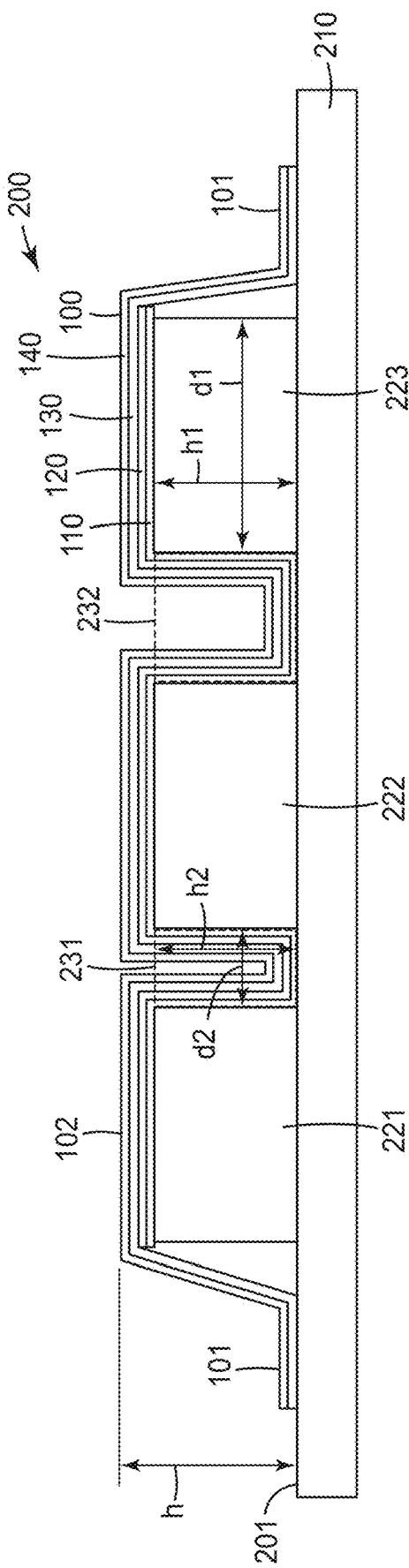
FIG. 2 is a cross sectional diagram illustrating a shielded electronic system that includes the multilayer shielding film of FIGS. 1A and 1B after the multilayer shielding film conforms to electronic components of the electronic system.

FIG. 2 is a cross sectional diagram illustrating a shielded electronic system 200 that includes the multilayer shielding film 100 described above. The shielded electronic system 200 comprises a substrate, e.g., circuit board 210 with a plurality of three dimensional objects, e.g., electronic devices 221, 222, 223 mounted on the circuit board 210. The multilayer shielding film 100 is shown in FIG. 2 after the multilayer shielding film 100 is conformed to electronic devices 221, 222, 223 mounted on a circuit board 210. The shielding film 100 substantially conforms to the electronic devices 221, 222, 223. The electrically conductive adhesive layer 130 adheres to the circuit board 210 around a perimeter region 101 of the shielding film 100 forming a shielding structure similar to a Faraday-type shield. The electrically conductive adhesive layer 130 forms a seal, which may be an air-tight seal, between the shielding film 100 and the circuit board 210 along the perimeter region 101 of the shielding film 100.

When one or more of heat, vacuum, and pressure is applied to the electronic system 200, the shielding film 100 substantially conforms to the devices 221, 222, 223 and to the circuit board 210. The multilayer shielding film 100 conforms to one or more electronic devices 221, 222, 223 mounted on a circuit board 210 and conform to the circuit board 210 such that the electrically conductive adhesive layer 130 adheres to the circuit board 210 providing a seal between the multilayer shielding film 100 and the circuit board 210. In some implementations, the seal is an air-tight seal. In some embodiments, at least 70%, at least 80%, at least 90%, or even at least 95% of the space defined between the multilayer shielding film and the circuit board is occupied by the one or more electronic devices.

The structured adhesive layer 110 is disposed on the outermost surfaces of one or more of the devices 221, 222, 223 and adheres the shielding film 100 to at least some of the outermost surfaces of at least some of the devices 221, 222, 223. In some embodiments, one or more of the three dimensional objects, e.g., electronic devices 221, 222, 223, on the circuit board 210 have a maximum width, $d_1$, and a minimum height, $h_1$, where it is possible for $d_1$ and $h_1$ to be the same or vary from device to device. In some implementations, the ratio $h_1/d_1$ is at least 2, or at least 3, or at least 4. The multilayer shielding film 100 may conform and/or adhere to at least 70%, at least 80%, at least 90%, or even at least 95% of the exposed outermost surface of one or more of the devices 221, 222, 223. The conformed electrically conductive adhesive layer 130 adheres to the substrate 210 to maintain conformity of the shielding film 100 to the one or more devices 221, 222, 223.

Neighboring devices mounted on the circuit board 210 have a space between them. Dashed box 231 indicates the space between neighboring devices 221 and 222 and dashed box 232 indicates the space between neighboring devices 222 and 223. The shielding film 100 may contact the circuit board 210 in the spaces 231, 232 between at least some of the neighboring devices 221, 222, 223. As shown in relation to space 231, each space 231, 232 between the devices has a maximum width, $d_2$, and a minimum height, $h_2$, where $d_2$ and $h_2$ can be substantially the same or can vary from space to space. In some embodiments, one or more of the spaces of the shielded electronic system have a ratio $h_2/d_2$ is at least 2, or at least 3, or at least 4. In some embodiments, when the multilayer film 100 conforms to the devices 221, 222, 223, at least 70%, at least 80%, at least 90%, or even at least 95% of one or more spaces defined between neighboring devices are occupied by the multilayer film 100.

Figure 3:
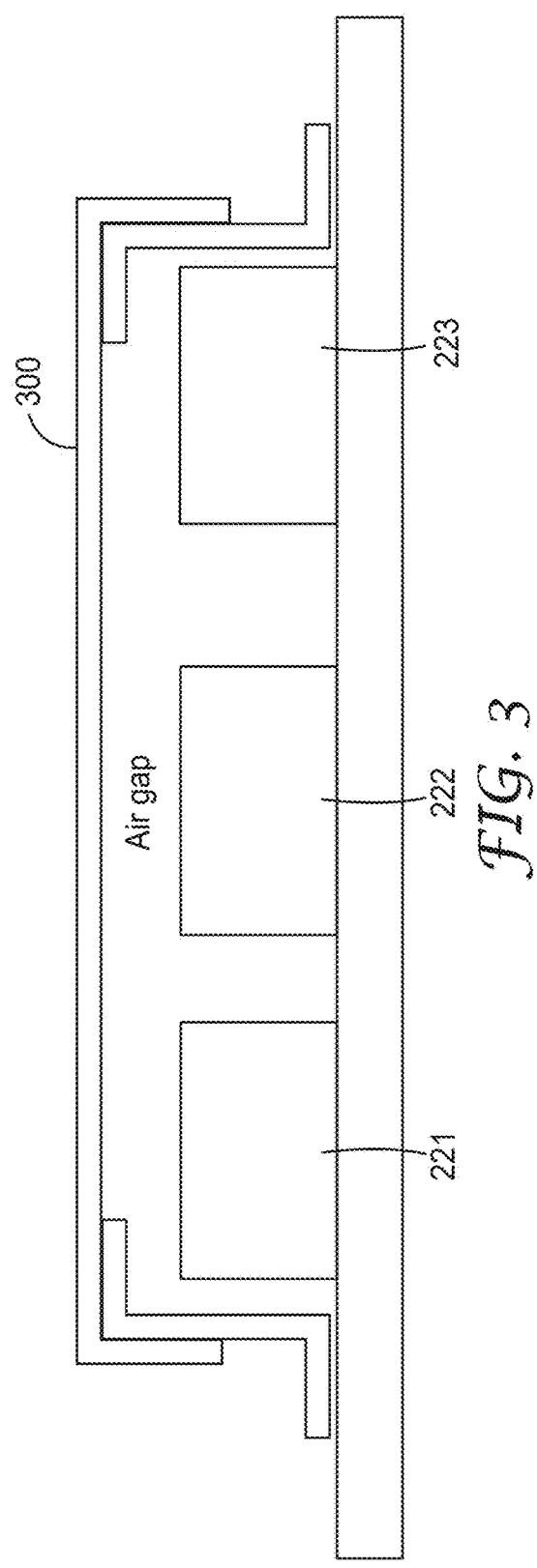
FIG. 3 is a cross sectional diagram illustrating a conventional Faraday-type EMI shield.

The formable multilayer shield 100 described herein provides a thinner profile, h, between the top surface 201 of the circuit board 210 and the top surface 102 of the shielding film 100 when compared to a conventional non-formable Faraday-type shield 300 shown in FIG. 3. As devices, such as mobile phones and/or other handheld devices, become smaller and thinner, the thinner profile of the formable multilayer shield described herein is useful to reduce the overall size and or thickness the electronic systems used in such devices.

The conventional Faraday-type shield 300 shown in FIG. 3 creates gaps between the surface of the electronic devices 321, 322, 323 and the bottom of the shield surface and/or gaps between the electronic devices 321, 322, 323. The gaps trap air proximate to the electronic devices 321, 322, 323, reducing the conduction of heat away from the electronic devices 321, 322, 323. In contrast, the conformable multilayer shielding film conforms to the outermost surfaces of the devices 221, 222, 223 and to the circuit board, reducing air gaps and trapped heat between the electronic devices 221, 222, 223 and the shielding film 100 and/or between neighboring electronic devices. Furthermore, the electrically insulative thermally conductive layer 130 conducts heat generated by the electronic devices 221, 222, 223 to the electrically conductive shielding layer 140 (which is also thermally conductive). Thus, the heat from the electronic devices 221, 222, 223 is more readily dissipated via the electrically insulative thermally conductive layer 130 and the electrically conductive shielding layer 140. In some embodiments, the electrically conductive shielding layer 140 carries heat to a metal layer on the circuit board 210 that extends under the perimeter region 101 of the shielding film. The metal layer on the circuit board 210 may serves as an additional heat dissipation surface that dissipates heat generated by the electronic devices 221, 222, 223 and carried to the metal layer by the electrically conductive shielding layer 140 and the electrically conductive adhesive layer 130.

Figure 4A:
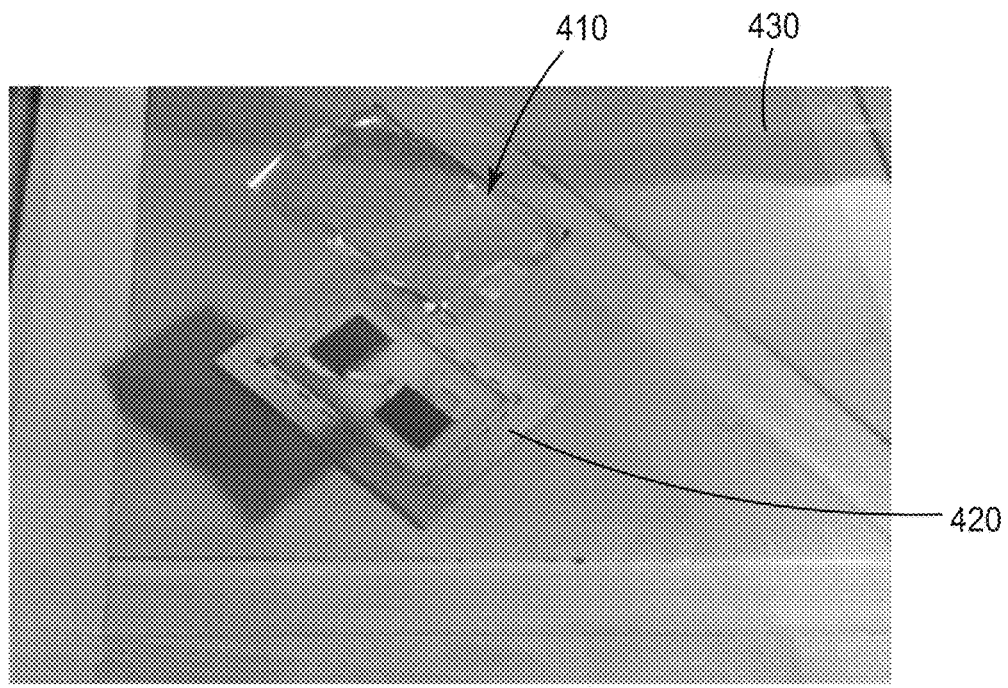
FIGS. 4A and 4B illustrate a process of conforming a multilayer shielding film to a subassembly comprising a circuit board upon which electronic devices are mounted in accordance with some embodiments.
Figure 4B:
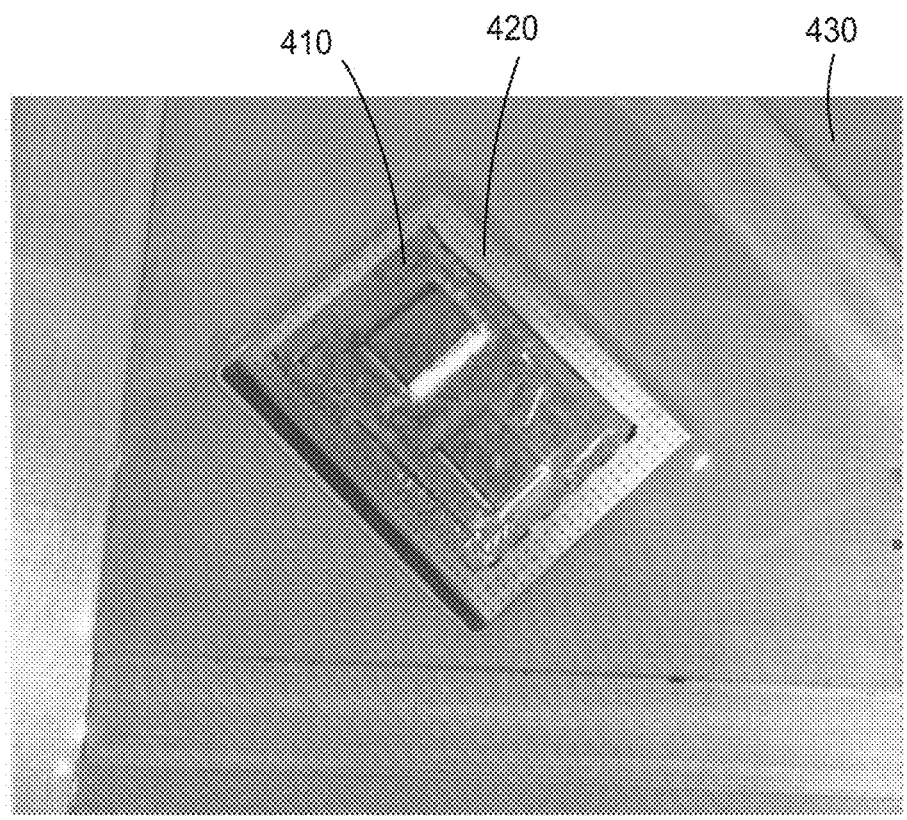

The multilayer shielding film may be conformed to the outer surfaces of three dimensional objects mounted on a substrate, such as electronic devices mounted to a circuit board, using at least one of heat, pressure, and vacuum. FIGS. 4A and 4B illustrate a process of conforming the multilayer shielding film 410 to a subassembly 420 comprising a circuit board upon which electronic devices are mounted. FIG. 4A illustrates the multilayer film 410 and subassembly 420 before the multilayer film 410 is conformed to the circuit board and electronic components of the subassembly 420. The multilayer film 410 is attached to a polyethylene terephthalate (PET) carrier film 430 and is shown disposed above the subassembly 420 in FIG. 4A.

The multilayer film 410 is positioned on the circuit board and electronic devices. The multilayer film 410 is repositionable on the electronic devices and circuit board before application of heat, vacuum, and/or pressure, when the ribs of the structured adhesive layer make contact with the electronic components mounted on the circuit board. The structured adhesive layer of the multilayer film 410 adheres the multilayer film 410 to the electronic devices slightly, but allows the multilayer film 410 to be repositioned as needed before more complete adhesion occurs.

The multilayer shielding film 410 is conformed to the circuit board 420 by one or more of heat, vacuum, and pressure. For example, in some implementations, the multilayer shielding film 410 is conformed to the subassembly 420 by applying a vacuum and heating the multilayer shielding film 410 and subassembly 420 to a temperature of about 90° C. at a pressure of about 2 kg/cm² for about 60 seconds, although other settings may be used. The multilayer shielding film 410 conforms to the outer surfaces of the electronic components on the circuit board and the circuit board itself. The edges of the multilayer film where the electrically conductive adhesive contacts the surface of the circuit board adhere to the circuit board to form a seal, e.g., an air tight seal, between the multilayer shielding film 410 and the circuit board. The structured adhesive of the multilayer shielding film adheres firmly to the outer surfaces of the electronic components after application the heat, pressure, and/or vacuum. FIG. 4B shows the electronic system including multilayer shielding film 410 conforming and adhered to the subassembly 420 comprising the circuit board and components after application of heat, vacuum, and pressure.

Items described herein include:

Item 1. A multilayer shielding film comprising:
 a structured adhesive layer;
 an electrically conductive shielding layer extending laterally beyond the structured adhesive layer;
 an electrically insulative thermally conductive layer disposed on the structured adhesive layer and between the electrically conductive shielding layer and the structured adhesive layer and coextensive with the structured adhesive layer; and
 an electrically conductive adhesive layer disposed between the electrically conductive shielding layer and the thermally conductive layer and coextensive with the electrically conductive shielding layer, such when the multilayer shielding film is placed on an electronic device mounted on a circuit board and under application of one or more of heat, vacuum, and pressure, the multilayer shielding film conforms to the electronic device and the electrically conductive adhesive layer adheres to the circuit board providing a seal between the multilayer shielding film and the circuit board.

Item 2. The multilayer shielding film of item 1, wherein the electrically conductive shielding layer comprises an electrically conductive non-woven material comprising a plurality of electrically conductive fibers.

Item 3. The multilayer shielding film of any of items 1 through 2, wherein a thickness of the electrically conductive shielding layer is less than about 30 microns.

Item 4. The multilayer shielding film of any of items 1 through 3, wherein the thermally conductive layer is halogen-free.

Item 5. The multilayer shielding film of any of items 1 through 4, wherein a thickness of the thermally conductive layer is less than about 100 microns.

Item 6. The multilayer shielding film of any of items 1 through 5, wherein a thermal resistance of the thermally conductive layer is greater than about $3° C.\cdot cm^2/W$ and less than about $5° C.\cdot cm^2/W$.

Item 7. The multilayer shielding film of any of items 1 through 6, wherein a breakdown voltage of the thermally conductive layer is greater than about 4 kV.

Item 8. The multilayer shielding film of any of items 1 through 7, wherein the electrically conductive adhesive layer comprises conductive particles.

Item 9. The multilayer shielding film of any of items 1 through 8, such that when the multilayer shielding film is placed on an electronic device mounted on a circuit board and under the application of one or more of heat, vacuum, and pressure, the shielding film conforms to the electronic device and the adhesive layer adheres to the circuit board providing the seal between the shielding film and the circuit board, at least 90% of space defined between the multilayer shielding film and the circuit board is occupied by the electronic device.

Item 10. The multilayer shielding film of any if items 1 through 8, such that when the multilayer shielding film is placed on two electronic devices mounted on a circuit board, the two electronic devices defining a space therebetween having a maximum width d and a minimum height h, h/d being at least 3, and when under application of heat, vacuum and pressure, the shielding film conforms to the two electronic devices and the adhesive layer adheres to the circuit board providing the seal between the shielding film and the circuit board, at least 90% of the space defined between the two electronic devices is occupied by the multilayer shielding film.

Item 11. The multilayer shielding film of item 10, wherein the multilayer shielding film physically contacts the circuit board in the space defined between the two electronic devices.

Item 12. The multilayer shielding film of any of items 1 through 11, wherein when the multilayer shielding film is placed on an electronic device mounted on a circuit board under vacuum at a temperature of about 90° C. and a pressure of about 2 kg/cm$^2$ for about 60 seconds, the shielding film conforms to the electronic device and the adhesive layer adheres to the circuit board providing the seal between the shielding film and the circuit board.

Item 13. The multilayer shielding film of any of items 1 through 12, wherein the multilayer shielding film has an S21 isolation of less than about −20 dB.

Item 14. The multilayer shielding film of any of items 1 through 13, wherein the multilayer shielding film has an S21 isolation of less than about −40 dB.

Item 15. The multilayer shielding film of any of items 1 through 14, wherein the structured adhesive layer comprises a plurality of spaced apart substantially parallel adhesive ribs.

Item 16. The multilayer shielding film of any of items 1 through 15, wherein a thickness of the structured adhesive layer is in a range from about 30 to 50 microns.

Item 17. The multilayer shielding film of any of items 1 through 16, wherein the coextensive electrically conductive shielding layer and the electrically conductive adhesive layer extend laterally beyond the coextensive structured adhesive layer and the electrically insulative thermally conductive layer by at least about 2 mm.

Item 18. The multilayer shielding film of any of items 1 through 17, wherein the coextensive electrically conductive shielding layer and the electrically conductive adhesive layer (3) extend laterally beyond the coextensive structured adhesive layer (1) and the electrically insulative thermally conductive layer (2) by about 3 mm.

Item 19. The multilayer shielding film of any of items 1 through 18, wherein the seal is an air-tight seal.

Item 20. A shielded electronic system comprising:
  a circuit board;
  a plurality of discrete spaced apart electronic devices mounted on the circuit board; and
  a multilayer shielding film disposed on and covering the electronic devices and comprising:
    a structured adhesive layer;
    an electrically conductive shielding layer disposed on and extending laterally beyond the structured adhesive layer;
    an electrically insulative thermally conductive layer disposed between the electrically conductive shielding layer and the structured adhesive layer and coextensive with the structured adhesive layer; and
    an electrically conductive adhesive layer disposed between the electrically conductive shielding layer and the thermally conductive layer and coextensive with the electrically conductive shielding layer, the shielding film substantially conforming to each electronic device, the adhesive layer adhering to the circuit board and providing a seal between the shielding film and the circuit board, the shielding film physically contacting the circuit board between at least two neighboring electronic devices.

Item 21. The shielded electronic system of item 20, wherein the multilayer shielding film occupies at least 90% of space defined between each pair of adjacent electronic devices in the plurality of discrete spaced apart electronic devices.

Item 22. A multilayer shielding film comprising:
  a structured adhesive layer;
  an electrically conductive shielding layer disposed on and extending laterally beyond the structured adhesive layer;
  an electrically insulative thermally conductive layer disposed between the electrically conductive shielding layer and the structured adhesive layer and coextensive with the structured adhesive layer; and
  an electrically conductive adhesive layer disposed between the electrically conductive shielding layer and the thermally conductive layer and coextensive with the electrically conductive shielding layer, such that under application of one or more of heat, vacuum, and pressure, the shielding film substantially conforms and adheres to at least 90% of an exposed outermost surface of a three dimensional object mounted on a substrate, the object having a maximum width d and a minimum height h, h/d being at least 3, the conformed electrically conductive adhesive layer adhering to the substrate to maintain conformity of the shielding film to the object.

Item 23. The multilayer shielding film of item 22, wherein the three dimensional object comprises an electronic device.

Various modifications and alterations of the embodiments discussed above will be apparent to those skilled in the art, and it should be understood that this disclosure is not limited to the illustrative embodiments set forth herein. The reader should assume that features of one disclosed embodiment can also be applied to all other disclosed embodiments unless otherwise indicated.

The invention claimed is:

1. A multilayer shielding film comprising:
  a structured adhesive layer comprising a pattern of adhesive material;
  an electrically conductive shielding layer extending laterally beyond the structured adhesive layer;
  an electrically insulative thermally conductive layer disposed on the structured adhesive layer and between the electrically conductive shielding layer and the structured adhesive layer and coextensive with the structured adhesive layer, such that the pattern of adhesive material of the structured adhesive layer covers some, but not all, of the thermally conductive layer; and
  an electrically conductive adhesive layer disposed between the electrically conductive shielding layer and the thermally conductive layer and coextensive with the electrically conductive shielding layer, such that when the multilayer shielding film is placed on an electronic device mounted on a circuit board and under application of one or more of heat, vacuum, and pressure, the multilayer shielding film is adapted to conform to the electronic device, the structured adhesive layer disposed on at least a portion of a surface of the electronic device, and the electrically conductive adhesive layer is adapted to adhere to the circuit board providing a seal between the multilayer shielding film and the circuit board.

2. The multilayer shielding film of claim 1, wherein the electrically conductive shielding layer comprises an electrically conductive non-woven material comprising a plurality of electrically conductive fibers.

3. The multilayer shielding film of claim 1, wherein a thickness of the electrically conductive shielding layer is less than 30 microns.

4. The multilayer shielding film of claim 1, wherein the thermally conductive layer is halogen-free.

5. The multilayer shielding film of claim 1, wherein a thickness of the thermally conductive layer is less than 100 microns.

6. The multilayer shielding film of claim 1, wherein a thermal resistance of the thermally conductive layer is greater than about 3° C.·cm$^2$/W and less than about 5° C.·cm$^2$/W.

7. The multilayer shielding film of claim 1, wherein a breakdown voltage of the thermally conductive layer is greater than 4 kV.

8. The multilayer shielding film of claim 1, wherein the electrically conductive adhesive layer comprises conductive particles.

9. The multilayer shielding film of claim 1, such that when the multilayer shielding film is placed on an electronic device mounted on a circuit board and under the application of one or more of heat, vacuum, and pressure, the shielding film conforms to the electronic device and the adhesive layer adheres to the circuit board providing the seal between the shielding film and the circuit board, at least 90% of space defined between the multilayer shielding film and the circuit board is occupied by the electronic device.

10. The multilayer shielding film of claim 1, such that when the multilayer shielding film is placed on two electronic devices mounted on a circuit board, the two electronic devices defining a space therebetween having a maximum width d and a minimum height h, h/d being at least 3, and when under application of heat, vacuum and pressure, the shielding film conforms to the two electronic devices and the adhesive layer adheres to the circuit board providing the seal between the shielding film and the circuit board, at least 90% of the space defined between the two electronic devices is occupied by the multilayer shielding film.

11. The multilayer shielding film of claim 10, wherein the multilayer shielding film physically contacts the circuit board in the space defined between the two electronic devices.

12. The multilayer shielding film of claim 1, such that when the multilayer shielding film is placed on an electronic device mounted on a circuit board under vacuum at a temperature of about 90° C. and a pressure of about 2 kg/cm$^2$ for about 60 seconds, the shielding film conforms to the electronic device and the adhesive layer adheres to the circuit board providing the seal between the shielding film and the circuit board.

13. The multilayer shielding film of claim 1, wherein the multilayer shielding film has an S21 isolation of less than about −20 dB.

14. The multilayer shielding film of claim 1, wherein the multilayer shielding film has an S21 isolation of less than about −40 dB.

15. The multilayer shielding film of claim 1, wherein the structured adhesive layer comprises a plurality of spaced apart substantially parallel adhesive ribs.

16. The multilayer shielding film of claim 1, wherein a thickness of the structured adhesive layer is in a range from about 30 to 50 microns.

17. The multilayer shielding film of claim 1, wherein the coextensive electrically conductive shielding layer and the electrically conductive adhesive layer extend laterally beyond the coextensive structured adhesive layer and the electrically insulative thermally conductive layer by at least 2 mm.

18. The multilayer shielding film of claim 1, wherein the coextensive electrically conductive shielding layer and the electrically conductive adhesive layer (3) extend laterally beyond the coextensive structured adhesive layer (1) and the electrically insulative thermally conductive layer (2) by 3 mm.

19. The multilayer shielding film of claim 1, wherein the seal is an air-tight seal.

20. A shielded electronic system comprising:
 a circuit board;
 a plurality of discrete spaced apart electronic devices mounted on the circuit board; and
 a multilayer shielding film disposed on and covering the electronic devices and comprising:
  a structured adhesive layer comprising a pattern of adhesive material;
  an electrically conductive shielding layer disposed on and extending laterally beyond the structured adhesive layer;
  an electrically insulative thermally conductive layer disposed between the electrically conductive shielding layer and the structured adhesive layer and coextensive with the structured adhesive layer, such that the pattern of adhesive material of the structured adhesive layer covers some, but not all, of the thermally conductive layer; and
  an electrically conductive adhesive layer disposed between the electrically conductive shielding layer and the thermally conductive layer and coextensive with the electrically conductive shielding layer, such that, under application of one or more of heat, vacuum, and pressure, the shielding film is adapted to substantially conform to each electronic device, and the electrically conductive adhesive layer is adapted to adhere to the circuit board and provide a seal between the shielding film and the circuit board, the structured adhesive layer disposed on each electronic device, the shielding film physically contacting the circuit board between at least two neighboring electronic devices.

21. The shielded electronic system of claim 20, wherein the multilayer shielding film occupies at least 90% of space defined between each pair of adjacent electronic devices in the plurality of discrete spaced apart electronic devices.

22. A multilayer shielding film comprising:
 a structured adhesive layer comprising a pattern of adhesive material;
 an electrically conductive shielding layer disposed on and extending laterally beyond the structured adhesive layer;
 an electrically insulative thermally conductive layer disposed between the electrically conductive shielding layer and the structured adhesive layer and coextensive with the structured adhesive layer, such that the pattern of adhesive material of the structured adhesive layer covers some, but not all, of the thermally conductive layer; and an electrically conductive adhesive layer disposed between the electrically conductive shielding layer and the thermally conductive layer and coextensive with the electrically conductive shielding layer, such that under application of one or more of heat, vacuum, and pressure, the shielding film is adapted to substantially conform and adhere to at least 90% of an exposed outermost surface of a three dimensional object mounted on a substrate, the object having a maximum width d and a minimum height h, h/d being at least 3, the conformed electrically conductive adhesive layer adhering to the substrate to maintain conformity of the shielding film to the object, the structured adhesive layer disposed on at least a portion of a surface of the object.

23. The multilayer shielding film of claim 22, wherein the three dimensional object comprises an electronic device.

* * * * *